(12) United States Patent
Gorecki et al.

(10) Patent No.: US 6,701,340 B1
(45) Date of Patent: Mar. 2, 2004

(54) DOUBLE DIFFERENTIAL COMPARATOR AND PROGRAMMABLE ANALOG BLOCK ARCHITECTURE USING SAME

(75) Inventors: James L. Gorecki, Hillsboro, OR (US); Bill G. Gazeley, Corvallis, OR (US); Yaohua Yang, West Linn, OR (US)

(73) Assignee: Lattice Semiconductor Corp., Hillsboro, OR (US)

( * ) Notice: Subject to any disclaimer, the term of this patent is extended or adjusted under 35 U.S.C. 154(b) by 448 days.

(21) Appl. No.: 09/668,896

(22) Filed: Sep. 22, 2000

Related U.S. Application Data

(60) Provisional application No. 60/155,512, filed on Sep. 22, 1999.

(51) Int. Cl.[7] .............................. G06G 7/00; G06F 7/50
(52) U.S. Cl. ...................................... 708/801; 708/671
(58) Field of Search ............................... 708/801, 1–9, 708/671; 340/146.2

(56) References Cited

U.S. PATENT DOCUMENTS

| 4,250,556 A | | 2/1981 | Goser ......................... 364/600 |
| 4,531,113 A | | 7/1985 | Abraham ................. 340/347 C |
| 4,733,205 A | | 3/1988 | Hughes ....................... 333/172 |
| 4,801,888 A | | 1/1989 | Haque ........................... 330/9 |
| 4,857,778 A | | 8/1989 | Hague ......................... 307/521 |
| 5,068,823 A | | 11/1991 | Robinson ..................... 395/500 |
| 5,107,146 A | | 4/1992 | El-Ayat ....................... 307/465 |
| 5,146,112 A | * | 9/1992 | Ito et al. ......................... 708/1 |
| 5,196,740 A | | 3/1993 | Austin ......................... 307/303 |
| 5,245,262 A | | 9/1993 | Moody et al. ............... 318/560 |
| 5,311,142 A | | 5/1994 | Terane et al. ................. 330/10 |
| 5,416,484 A | | 5/1995 | Lofstrom ..................... 341/159 |
| 5,463,349 A | | 10/1995 | Petersen et al. ............. 330/254 |
| 5,554,957 A | | 9/1996 | Klein .......................... 330/251 |
| 5,557,234 A | | 9/1996 | Collins ........................ 327/563 |
| 5,574,678 A | | 11/1996 | Gorecki ....................... 364/807 |

(List continued on next page.)

FOREIGN PATENT DOCUMENTS

| EP | 0322382 B1 | 9/1994 |
| EP | 0871223 A1 | 10/1998 |
| EP | 0611165 B1 | 7/1999 |
| WO | WO 98/21726 | 5/1998 |

OTHER PUBLICATIONS

Maxim Integrated Products, "Digitally–Programmed, Dual $2^{nd}$ Order Continuous Lowpass Filters," Aug. 1997, pp. 1–16.

Massimo A. Sivolotti, "A Dynamically Configurable Architecture For Prototyping Analog Circuits," Mar. 1998, pp. 237–258.

Edward K. F. Lee and P. G. Gulak, "Prototype Design of a Field Programmable Analog Array," Aug. 30, 1990, pp. 2.2.1–2.2.8.

Edward K. F. Lee and P. Glenn Gulak, "A CMOS Field–Programmable Analog Array," *IEEE Journal Of Solid–State Circuits*, vol. 26, No. 12, Dec. 1991, pp. 1860–1867.

Frank Goodenough, "Analog Counterparts Of FPGAS Ease System Design," *Electronic Design*, Oct. 14, 1994.

IMP, Inc., Preliminary Product Information, IMP50E10 EPAC$^{TM}$ (Electrically Programmable Analog Circuit), Nov. 1994, pp. 1–16.

*Primary Examiner*—Tan V. Mai

(57) ABSTRACT

A double differential comparator can be efficiently implemented utilizing a first comparator stage having a folded cascode with floating gate input terminals and clamped single-ended output, and a capacitively coupled input stage for transferring a weighted sum of input signals to the floating gates of the first comparator stage. Additionally, the double differential comparator can be integrated into fully differential programmable analog integrated circuits. Such fully differential programmable analog integrated circuits can also include a differential output digital-to-analog converter to be used with or without the double differential comparator.

26 Claims, 5 Drawing Sheets

U.S. PATENT DOCUMENTS

| | | | |
|---|---|---|---|
| 5,608,345 A | 3/1997 | Macbeth et al. | 327/337 |
| 5,625,316 A | 4/1997 | Chambers et al. | 327/553 |
| 5,625,361 A | 4/1997 | Garrity et al. | 341/172 |
| 5,680,070 A | 10/1997 | Anderson et al. | 327/336 |
| 5,821,776 A | 10/1998 | McGowan | 326/41 |
| 5,864,495 A * | 1/1999 | Sakashita et al. | 708/801 |
| 5,877,612 A | 3/1999 | Straw | 330/254 |
| 5,905,398 A | 5/1999 | Todsen et al. | 327/337 |
| 5,912,567 A | 6/1999 | Drost et al. | 327/89 |
| 5,914,633 A | 6/1999 | Comino et al. | 327/553 |
| 5,952,952 A | 9/1999 | Choi et al. | 341/172 |
| 5,959,871 A | 9/1999 | Pierzchala et al. | 364/489 |
| 5,966,047 A | 10/1999 | Anderson et al. | 327/565 |
| 6,013,958 A | 1/2000 | Aytur | 307/109 |
| 6,014,097 A | 1/2000 | Brandt | 341/156 |
| 6,111,437 A | 8/2000 | Patel | 327/74 |

* cited by examiner

DOUBLE DIFFERENTIAL COMPARATOR AND PROGRAMMABLE ANALOG BLOCK ARCHITECTURE USING SAME

This application claims the benefit of U.S. Provisional Application No. 60/155,512, filed Sep. 22, 1999, under 35 U.S.C. §119 (e). The above-referenced provisional application is hereby incorporated by reference herein in its entirety.

BACKGROUND OF THE INVENTION

1. Field of the Invention

This invention relates to analog signal processing, and more particularly to comparators for analog signal processing and programmable integrated circuits that perform analog processing.

2. Description of the Related Art

Typically, analog integrated circuits are designed to receive one or more analog input signals, and process those signals by performing specific functions such as amplification, attenuation, filtering, integration, addition and subtraction. These functions usually dictate the topology of the analog integrated circuit. For example, the topologic arrangement of operational amplifiers and resistors are adjusted to provide either inverting or non-inverting gain. Every topology has specific noise, distortion and offset voltage sensitivities. Changing an analog circuit's function often requires a change in the topology of the analog circuit, which in turn changes the noise, distortion and offset voltage characteristics of the circuit.

An analog integrated circuit with a programmable analog circuit block architecture permits change in a function of the analog circuit without changing the topology of the circuit elements, thereby reducing changes in voltage offset and distortion created by changes in topology. Examples of such analog integrated circuit architectures can be found in U.S. Pat. No. 5,574,678, entitled "Continuous Time Programmable Analog Block Architecture," by James L. Gorecki, (the "Gorecki patent") which is incorporated herein by reference in its entirety.

Programmable analog integrated circuits such as those disclosed in the Gorecki patent, typically include analog circuit blocks interconnected by a programmable interconnect structure and provide a self contained integrated circuit architecture which supports basic analog signal processing functions. The analog circuit blocks include basic circuit elements such as operational amplifiers, resistors, and capacitors, which can be programmably connected in a variety of circuit configurations. Users can define the functionality of individual blocks, control their respective characteristics, and interconnect blocks to define an overall architecture. Integrating the elements together in a single integrated circuit has a number of advantages. Critical circuit specifications such as dynamic range and common mode rejection can be more easily controlled, helping to make circuit performance more predictable and reliable. The input and output characteristics of the programmable analog circuit block allow the block to be used within an analog routing pool with other programmable analog circuit blocks to provide more complicated analog circuits without significant degradation in performance. The elimination of external passive components and the addition of programmable interconnect structures for the circuit blocks also reduce the sensitivity of circuit designs to board-level variables and tolerances. Moreover, by removing sensitivity to an analog routing pool and facilitating internal modification of function without changing topologic sensitivity to offset and distortion, an integrated circuit can advantageously be provided with multiple programmable analog circuit blocks and an analog routing pool which can accommodate more complex analog functions.

One advantage of certain programmable analog integrated circuits, such as the ispPAC10™ in-system programmable analog integrated circuit from Lattice Semiconductor Corporation, is that they are fully differential from input to output. This effectively doubles dynamic range as compared to single-ended input/output (I/O), and affords improved performance with regard to specifications such as power-supply rejection (PSR) and total harmonic distortion (THD). However, to fully exploit the usefulness of the fully differential nature of these programmable analog integrated circuits, and in general any fully differential circuit, other fully differential circuits are needed. For example, many analog circuits utilize a comparator, i.e., a circuit that compares two input voltages, and produces a digital output that is either high or low depending upon the relationship of the two input voltages. Conventional comparators use single-ended inputs for the two input voltages and produce a single-ended output.

Accordingly, it is desirable to have a fully differential comparator, where both inputs are differential inputs, for use with fully differential analog circuits, including programmable analog integrated circuits and/or analog circuits comprising discrete components. Moreover, it is desirable to have a digital to analog converter (DAC) circuit with a differential output so as to provide a suitable differential reference voltage for the fully differential comparator. Additionally, it is desirable to have such fully differential analog circuit components that can be integrated into programmable analog integrated circuits as described above, thereby contributing to the numerous benefits of programmable analog integrated circuits.

SUMMARY OF THE INVENTION

It has been discovered that a double differential comparator can be efficiently implemented utilizing a first comparator stage having a folded cascode with floating gate input terminals and clamped single-ended output, and a capacitively coupled input stage for transferring a weighted sum of input signals to the floating gates of the first comparator stage. Additionally, the double differential comparator can be integrated into fully differential programmable analog integrated circuits. Such fully differential programmable analog integrated circuits can also include a differential output digital-to-analog converter to be used with or without the double differential comparator.

Accordingly, one aspect of the present invention provides a programmable analog integrated circuit for receiving a differential analog input signal and providing a processed differential analog output signal. The programmable analog circuit includes a first programmable analog circuit block, a double differential comparator, and an analog routing pool. The first programmable analog circuit block has first analog circuit block positive and negative input terminals and first analog circuit block positive and negative output terminals. The double differential comparator includes first comparator positive and negative input terminals, second comparator positive and negative input terminals, and comparator positive and negative output terminals. The double differential comparator providing a logic high output signal at the comparator output terminals when a first differential voltage applied to the first comparator input terminals is positive with respect to a second differential voltage applied to the second comparator input terminals. The analog routing pool controlling the routing of the differential analog input signal and signals provided by and to the first programmable analog circuit block and the double differential comparator. The analog routing pool is programmable.

In another aspect of the invention, a double differential comparator includes first comparator positive and negative input terminals, second comparator positive and negative input terminals, and comparator positive and negative output terminals. The double differential comparator providing a logic high output signal at the comparator output terminals when a first differential voltage applied to the first comparator input terminals is positive with respect to a second differential voltage applied to the second comparator input terminals.

The foregoing is a summary and this contains, by necessity, simplifications, generalizations and omissions of detail; consequently, those skilled in the art will appreciate that the summary is illustrative only and is not intended to be in any way limiting. As will also be apparent to one of skill in the art, the operations disclosed herein may be implemented in a number of ways, and such changes and modifications may be made without departing from this invention and its broader aspects. Other aspects, inventive features, and advantages of the present invention, as defined solely by the claims, will become apparent in the non-limiting detailed description set forth below.

BRIEF DESCRIPTION OF THE DRAWINGS

The present invention may be better understood, and its numerous objects, features, and advantages made apparent to those skilled in the art by referencing the accompanying drawings.

DETAILED DESCRIPTION

The following sets forth a detailed description of the best contemplated mode for carrying out the invention. The description is intended to be illustrative of the invention and should not be taken to be limiting.

Figure 1:
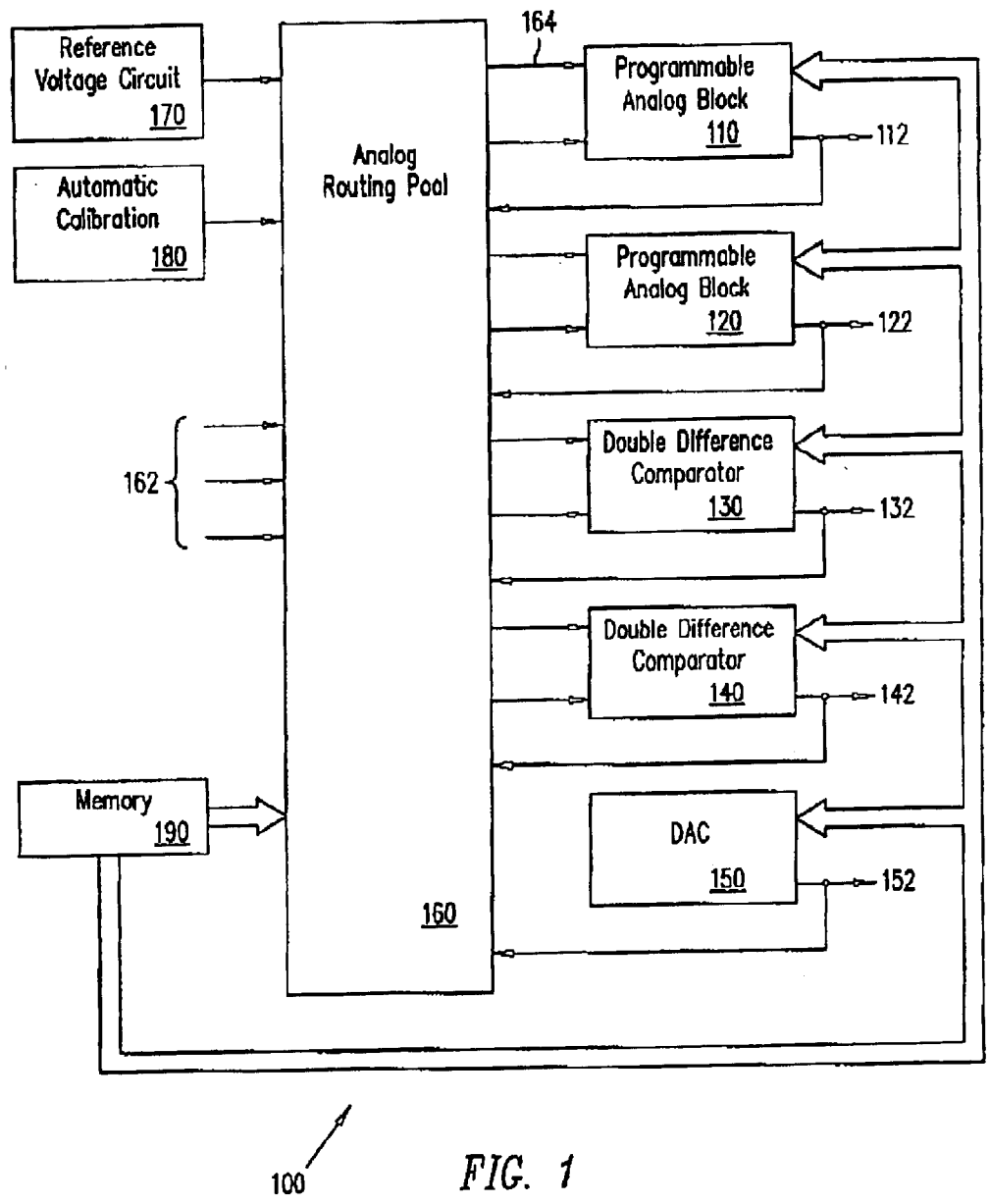
FIG. 1 is a block diagram of a programmable analog integrated circuit including two double difference comparators.

Referring to FIG. 1, a programmable analog integrated circuit 100 includes two programmable analog circuit blocks 110 and 120, two double difference comparator blocks 130 and 140, a differential output digital-to-analog converter (DAC) 150, and an analog routing pool 160. Programmable analog integrated circuit 100 also includes support circuitry coupled to interconnect array 160, such as voltage reference circuit 170, power-on auto-calibration circuitry 180, and configuration memory 190. Differential input signals 162 are received by analog routing pool 160, and can be routed to any of programmable analog circuit blocks 110 and 120, double difference comparator blocks 130 and 140, and external output terminals (not shown), depending upon the programming of analog routing pool 160. Analog routing pool 160 also controls the routing of the output signals of each of the programmable analog circuit blocks 110 and 120, double difference comparator blocks 130 and 140, differential output DAC 150, and external output terminals.

The routing of the analog routing pool is determined by information stored in memory 190. More specifically, individual bits stored within memory 190 control whether individual switches of analog routing pool 160 are on or off. Memory 190 also stores similar information for programming the programmable analog circuit blocks 110 and 120, the double difference comparators 130 and 140, and the differential output DAC 150.

Memory 190 can be implemented using both non-volatile and volatile memories, such as static read only memory, dynamic random access memory, static random addressable memory, shift registers, electronically erasable ($E^2$) memory, and flash memory. Reference voltage circuit 170 provides a stable voltage reference, e.g., 2.5 V, to analog routing pool 160 for use throughout programmable analog integrated circuit 100.

Programmable analog circuit blocks 110 and 120 can include operational amplifiers, resistors, capacitors, and other basic analog circuit elements. Examples of typical programmable analog circuit blocks 110 and 120 include the PACblock illustrated on page 10 of Appendix A of the aforementioned U.S. Provisional Application No. 60/155,512. Another example of programmable analog circuit blocks 110 and 120 is described in the Gorecki patent, and will be described in greater detail below in conjunction with FIG. 2. In general, programmable analog circuit blocks 110 and 120 flexibly implement basic analog circuit functions such as precision filtering, summing/differencing, gain/attenuation, and integration.

Programmable analog circuit blocks 110 and 120 can be implemented as single-ended circuit blocks, although in a preferred embodiment, they are fully differential from input to output. Note that for simplicity in FIG. 1 (as well as FIG. 6), each of the differential input signals 162, each of the two differential input signals to programmable analog circuit blocks 110 and 120, each of the two differential input signals double difference comparator blocks 130 and 140, and each of the differential output signals 112, 122, and 152 are shown as single lines, even though they each preferably represent a differential signal pair. So, for example, differential output signal 164 represents a pair of output signals, one having a positive voltage with respect to the other.

The circuits illustrated are implemented with fully differential circuit pathways in their preferred embodiments, although single-ended operation is possible by design, by programming, or via conversion circuits at the input and output nodes. Differential architecture substantially increases dynamic range as compared to single-ended I/O, while affording improved performance with regard to circuit specifications such as common mode rejection and total harmonic distortion. Moreover, differential operation affords added immunity to variations in the circuit's power supply.

Automatic calibration circuit 180 is used to calibrate circuit elements of programmable analog integrated circuit 100, such as programmable analog circuit blocks 110 and 120. Typically, a calibration mode is initiated by, for example, a circuit power on signal (i.e., anytime the circuit is turned on) or by a specific calibrate command signal that allows calibration to be requested at any time. In a preferred embodiment, simultaneous successive approximation routines (SAR) are used to determine the amount of offset error referred to each of the output amplifiers used in programmable analog circuit blocks 110 and 120. That error is then nulled by a calibration DAC for each output amplifier. The calibration constant can be stored in memory 190, but is preferably recomputed each time programmable analog integrated circuit 100 enters a calibration mode. One example of an automatic calibration circuit 180 is described in U.S. patent application Ser. No. 09/053,251, entitled "Offset Voltage Calibration DAC with Reduced Sensitivity to Mismatch Errors," by James L. Gorecki and Yaohua Yang, which is incorporated herein by reference in its entirety.

Double difference comparator blocks 130 and 140 provide truly differential comparators where both inputs are differential inputs and the output is a differential output. In principle, comparators 130 and 140 operate no differently than any standard, single-ended comparator, i.e., whenever the plus (or signal) input is positive with respect to the minus (or reference) input, the comparators' logic output signal will be high, otherwise they will be low. However, with the double difference comparators 130 and 140, both the plus and minus input terminals can receive a positive (Vin+) and a negative (Vin−) input signal, with the differential input voltage defined as [(Vin+)−(Vin−)]. Thus, the output of comparator 130 or 140 is high whenever the differential voltage on the plus input is positive with respect to the differential input voltage on the minus input. Like programmable analog circuit blocks 110 and 120, double difference comparators 130 and 140 provide output signals (132 and 142, respectively) that can be accessed by pins external to programmable analog integrated circuit 100 or routed to other parts of circuit 100 (e.g., double difference comparators 130 and 140) either directly or through some switching circuitry such as analog routing pool 160. Additionally, and as seen below in conjunction with FIG. 6, a number of user programmable features can be implemented to optimize the utility of the double difference comparators.

In many applications using comparators, it is desirable to compare a signal to a known reference. This can be accomplished with programmable analog integrated circuit 100 in a variety of ways. For example, a reference signal can be coupled to one of the differential inputs 162, and subsequently routed to one or both of the double difference comparators 130 and 140 via analog routing pool 160. Similarly, a differential output signal from one of the programmable analog circuit blocks 110 and 120 can be routed to one or both of the double difference comparators 130 and 140 via analog routing pool 160. Finally, differential output DAC 150 can be programmed to produce a differential analog signal that is routed to one or both of the double difference comparators 130 and 140 via analog routing pool 160.

Figure 2:
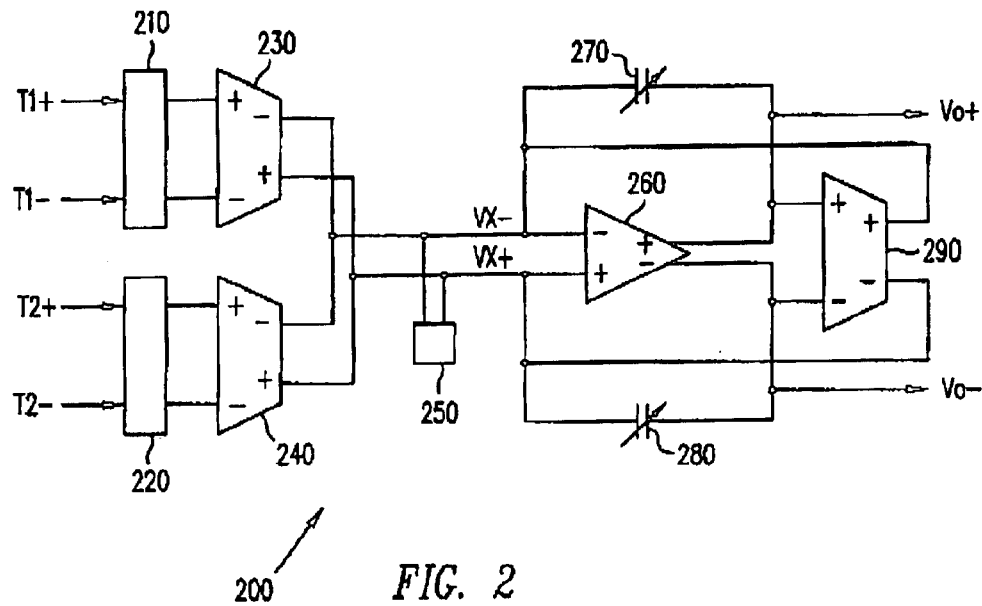
FIG. 2 is a simplified schematic diagram of a programmable analog circuit block such as the programmable analog circuit blocks shown in FIG. 1.

FIG. 2 is a simplified schematic diagram of a programmable analog circuit 200, such as programmable analog circuit block 110 and 120. Programmable analog circuit 200 includes polarity control circuits 210 and 220, input transconductors 230 and 240, terminator circuit 250, differential amplifier 260, programmable capacitor arrays 270 and 280, and feedback transconductor 290. Programmable analog circuit 200 is typically programmed using information stored within a memory, such as memory 190 of FIG. 1.

Polarity control for input signals provided to input transconductors 230 and 240 is performed by polarity control multiplexers 210 and 220. Polarity control multiplexers 210 and 220 each receive a single differential input signal, and, under control of information stored in a memory, couple the signal to both the positive '+' and negative '−' transconductor inputs. Transconductors are differential voltage to differential current converters, and typically have high input impedance, e.g., $10^{10}$ ohms and high output impedance, e.g., greater than $10^6$ ohms.

The high input impedance permits the input of the transconductor to be connected to other devices without drawing DC current, i.e., without loading down the other devices. For example, MOS devices preceding the input to the transconductor have no DC current flowing through them, and therefore they do not contribute to noise or distortion in the circuit. Additionally, the high output impedance permits several transconductors to be connected in parallel, thus summing the currents of the transconductors without affecting the transconductance value of each individual transconductor. The transconductor output currents can also be turned off (i.e., tri-stated), thus effectively eliminating the transconductor from the circuit.

By coupling the outputs of differential amplifier 260 to the inputs of differential amplifier 260, these inputs effectively become a virtual ground, i.e., a point in the circuit which is effectively held to zero differential voltage by means of the high gain of differential amplifier 260. Thus, differential amplifier 260 holds differential amplifier inputs effectively to zero differential voltage and provides a low output impedance to drive external circuitry or other programmable analog circuit blocks. By holding the virtual ground to effectively zero differential voltage, differential amplifier 260 performs the linear signal summing function as mentioned above while reducing distortion due to parasitic capacitances at the outputs of the transconductors and the capacitor arrays.

Programmable capacitor arrays 270 and 280 are used to add or eliminate capacitance from programmable analog circuit 200. Each programmable capacitor array 270, 280 includes integrated capacitors and a plurality of MOS switches controlling which, if any, integrated capacitor is active within programmable analog circuit 200. Capacitors that are not active within the capacitor array are automatically connected to the reference voltage, thereby eliminating the capacitors from any circuit interaction.

Figure 3:
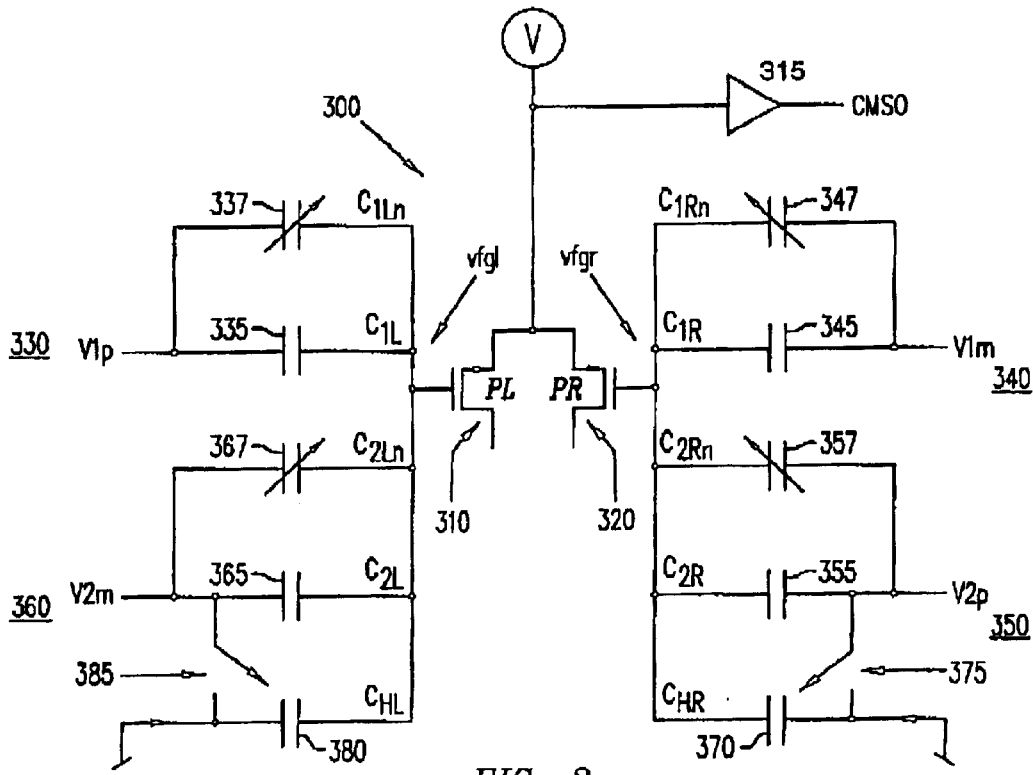
FIG. 3 is a simplified schematic diagram of a portion of a double difference comparator such as the double difference comparator shown in FIG. 1.

FIG. 3 is a simplified schematic diagram of a portion of a double difference comparator 300. In general, double differential comparators such as those shown in FIG. 1 comprise a first stage comparator, typically a folded cascode input stage with clamped single-ended output. This first stage drives a secondary voltage comparator that uses a reference input signal set by the diode-connected side of the folded cascode stage. A Schmitt trigger is typically used as a final gain stage. FIG. 3 illustrates the first stage of the comparator, along with a capacitively coupled input stage for transferring a weighted sum of the input signals to floating gates of the comparator first stage.

P-channel MOSFETs 310 and 320, coupled at their sources, provide a differential input comparator whose input terminals are coupled to the floating gates of the MOSFETs. Each of the floating gates of MOSFETs 310 and 320 are coupled to two voltage input terminals through respective coupling capacitors. Thus, first positive input terminal 330 is coupled through capacitor 335, first negative input terminal 340 is coupled through capacitor 345, second positive input terminal 350 is coupled through capacitor 355, and second negative input terminal 360 is coupled through capacitor 365. Note that through the use of coupling capacitors, and the illustrated scheme where opposite polarity signals from the same differential pair are coupled to different floating gates, double difference comparison is efficiently accomplished. Common-source (CMSO) amplifier 315 serves as a buffer for an external output pin used during calibration of double difference comparator 300.

Double difference comparator first stage 300 also includes hysteresis capacitors 370 and 380 selectively coupled (via switches 375 and 385) in parallel with, for example, coupling capacitors 355 and 365, respectively. Use of hysteresis capacitors 370 and 380 supports a hysteresis function for the comparator's "trip point."

Each of the coupling capacitors 335, 345, 355, and 365 has an associated trim capacitor 337, 347, 357, and 367 coupled in parallel. Each trim capacitor 337, 347, 357, and 367 is typically implemented as a bank of several individual capacitors coupled in parallel, and each of these individual capacitors is coupled in series with a manufacturer-controlled switch so that individual capacitors can be selectively included or excluded from the circuit. The values of the individual trim capacitors are numerically weighted (e.g., binarily weighted), and typically scaled to each have a capacitance that is some set percentage of the associated "fixed" capacitor (e.g., capacitor 335, 345, 355, or 365). Although not shown, coupling capacitors 335, 345, 355, and 365 can include "fixed" trim capacitors in addition to the trim capacitors coupled in series with manufacturer-controlled switches. Alternately, the trim capacitors can be designed to be automatically electronically coupled into the circuit so that the trimming process involves opening switches to remove associated trim capacitors from the circuit. Access to the manufacturer-controlled switches is usually limited by an integrated circuit programming or I/O interface command or secret key value. Note that capacitor trim circuits and techniques may be less important, or even unnecessary, where the circuit fabrication processes yield good capacitor matching. In such cases, parasitic effects due to switches and control lines used in the trim circuits can cause substantial offset shifts, which can be more detrimental to the performance of the circuit than any fabrication-process-induced capacitor mismatch.

For optimum operation of a double difference comparator using comparator first stage 300, it may be desirable to match the capacitances of the two halves of the comparator first stage. Although the capacitors on each side of the comparator first stage are typically designed to be nominally equal, and thus the capacitances of the two halves are nominally equal, process variation and manufacturing differences inevitably lead to capacitive mismatch that, if substantial, must be addressed using the trim capacitors. The difficulty of the capacitor trim process is compounded by the fact that MOSFETs 310 and 320 have floating gates. Consequently, a three step trim process is utilized to achieve best performance from double difference comparators: (1) match the same side input coupling capacitors, e.g., match the combined capacitance of 335 and 337 to the combined capacitance of 365 and 367; (2) match the floating gate voltages vfgl and vfgr; and (3) match capacitances of the right side of the comparator input stage to those of the left side.

To perform the first trim step on, for example, the left side of comparator first stage 300, MOSFET 320 is turned off so that the floating gate voltage is as high as possible, and MOSFET 310 effectively becomes a source follower. Starting with the center value of the trim capacitor arrays 337 and 367, and stepping these trim capacitors in opposite and equal directions from the common mode voltage. The difference between the initial and post-step values (i.e., the change in the floating gate voltage on MOSFET 310, $\Delta$vfgl) indicates the error in matching the capacitances of capacitor 335 plus capacitor 337, with capacitor 365 plus capacitor 367. These changes can be observed at the output of CMSO amplifier 315, which buffers the conmmon-source voltage of the two PMOS devices. If $\Delta$vfgl is positive, the capacitance associated with input terminal 330 is greater than that of input terminal 360, and the capacitances can be equalized by adding trim capacitors to 365 (i.e., switching in additional trim capacitors that are part of trim capacitor array 367) or subtracting trim capacitors from 335. Conversely, for negative $\Delta$vfgl, trim capacitors are added to 335 or subtracted from 365. A similar process is used to match the capacitors on the right side of comparator first stage 300.

To match the floating gate voltages vfgl and vfgr, all of the left side comparator inputs are tied together (including the hysteresis capacitor 380), and all off the right side comparator inputs are tied together. A differential sawtooth signal is applied across the two comparator sides, and the time that the comparator output is high ($T_h$) is measured. The offset is determined from the equation $V_{off}=V_{pp}(0.5-T_h/P)$, where $V_{PP}$ is the peak-to-peak voltage of the sawtooth and P is the period of the sawtooth. The offset voltage is then used to determine a trim voltage to apply across a tunnel oxide associated with one of the floating gates, thereby depositing a desired charge on the floating gate to achieve the desired matching characteristics.

The goal of the last trim step is to match the total capacitance ratio for the left side of comparator first stage 300, with that of the right side, but without disturbing the relationship between capacitors on one side, e.g., the relationship between capacitors 335 and 365. This trim step can be accomplished using a technique similar to the second trim step, but where the capacitors are connected as in normal operation. Input terminals 360 and 350 are connected together and biased to 3 VDC, while the sawtooth signal from the second trim step is then applied to 330 and 340, and the offset measured as $V_{off}=V_{pp}(0.5-T_h/P)$. The change in offset voltage associated with adjusting both trim capacitor arrays on the same side of comparator first stage 300 is monitored, and both trim capacitor array adjustments repeated as necessary until the offset is minimized.

Figure 4:
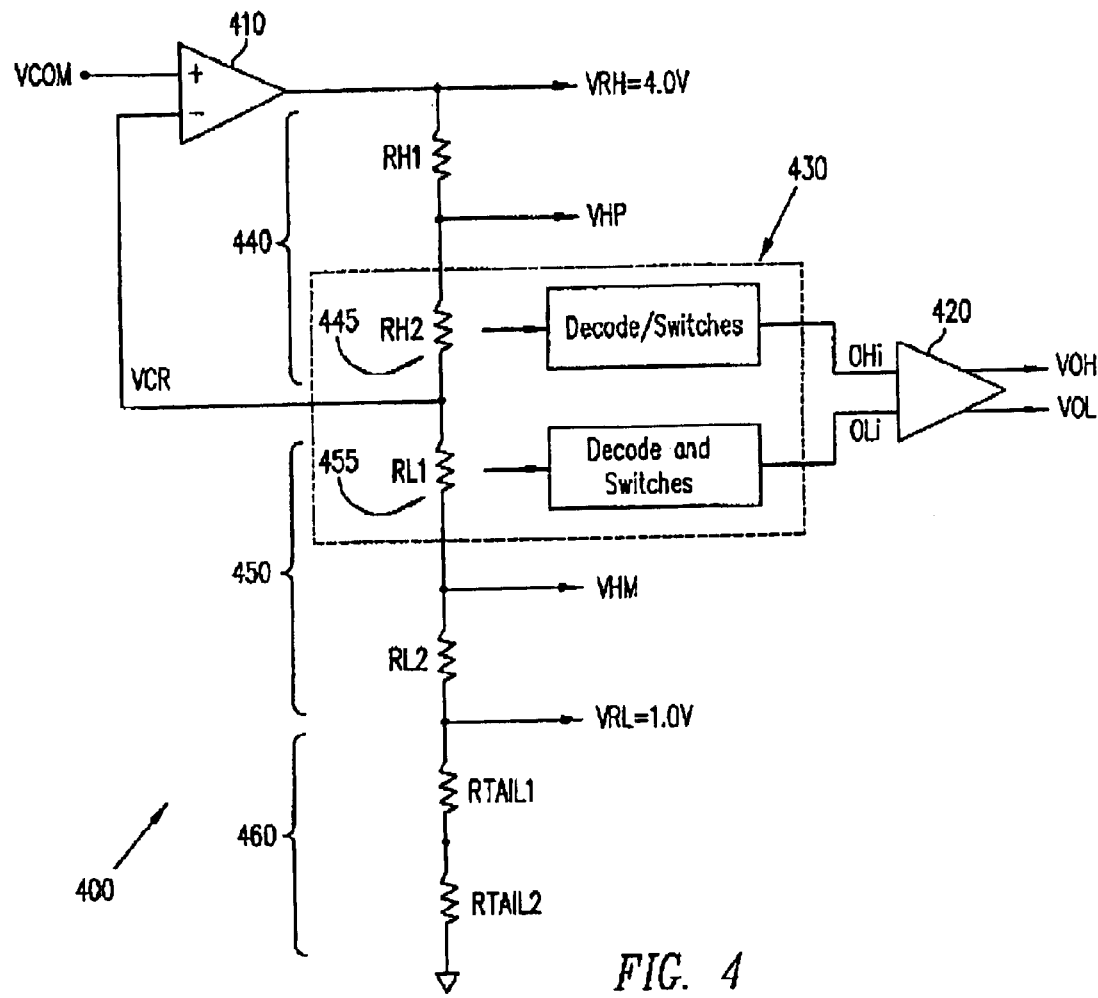
FIG. 4 is a simplified schematic diagram of a differential output digital-to-analog converter, such as the differential output digital-to-analog converter shown in FIG. 1.

Referring to FIG. 4, a simplified schematic diagram of a differential output digital-to-analog converter 400 is shown. Differential output digital-to-analog converter 400 is based on a resistor-string architecture, and includes additional taps of the resistor string for on-chip use as fixed reference voltages (e.g., full-scale reference voltages VRH and VRL, and half-scale reference voltages VHP and VHM), and to drive hysteresis inputs (e.g., the two least significant bits of output from DAC 400). Reference amplifier 410 provides the reference voltage based on VCOM, which is generated form a bandgap reference circuit. A differential voltage amplifier 420 allows DAC 400 to drive resistive and capacitive loads differentially.

At its core, differential output digital-to-analog converter 400 is based on an intrinsic 8-bit differential DAC 430 including analog switches and decode circuitry to multiplex the appropriate resistor tap voltage to the output. The resistor string is segmented into 256 legs for RH 440 (shared between RH1 and RH2), 256 legs for RL 450 (shared between RL1 and RL2), and 171 legs for RTAIL 460 (shared between RTAIL1 and RTAIL2). The portions of the resistor string within intrinsic 8-bit DAC 430 include two 128 leg resistor strings RH2 445 and RL1 455, so as to allow differential DAC output to range between +/−(VRH−VRL−1LSB), while still utilizing an 8-bit address.

Figure 5:
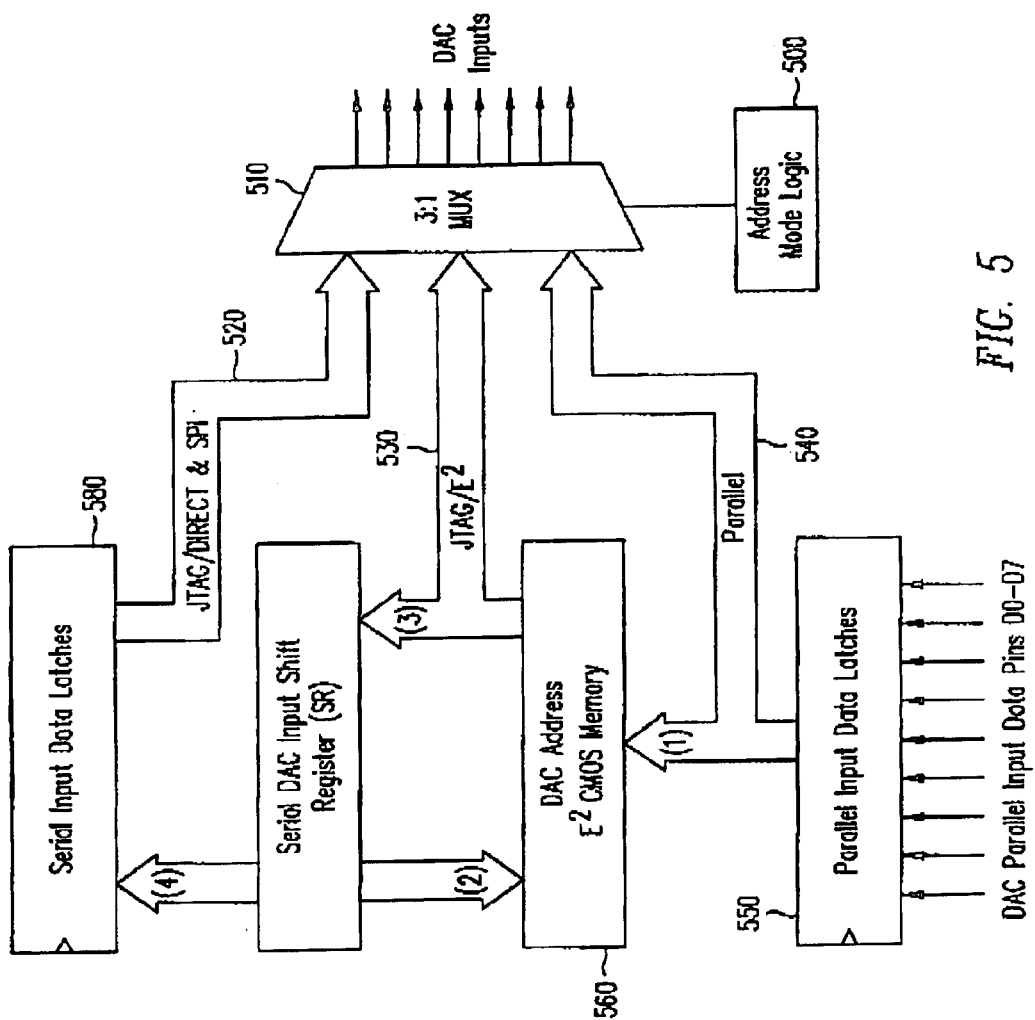
FIG. 5 illustrates several schemes for interfacing with a digital-to-analog converter.

In general, externally programming a programmable analog integrated circuit, such as circuit 100, requires some form of interface made external to the circuit. Examples of suitable I/O interfaces include the serial peripheral interface (SPI) from Motorola, Inc., the Joint Test Access Group (JTAG) interface associated with the IEEE Standard Test Access Port and Boundary Scan Architecture (IEEE 1149.1), and simple parallel ports. Use of these, and other, interfaces for programming integrated circuits is well known to those having ordinary skill in the art. FIG. 5 illustrates several of these schemes used specifically for interfacing with a digital-to-analog converter. In a typical implementation, interface modes are user selectable from among a direct 8-bit parallel port, a serial JTAG address mode, and a serial SPI address mode.

Data input to the DAC, whether in serial or parallel mode, determines its output value, and coding of the DAC is in straight binary corresponding to pre-specified input-to-output relationships as determined by the resistor string used. Addressing modes are controlled via address mode logic 500 in combination with MUX 510, which typically use user-programmable memory, signals from external pins, or some combination of the two. The various input data paths used to implement the various DAC addressing modes are described below.

JTAG/Direct & SPI 520: In this mode, the DAC can be addressed directly, bypassing $E^2$ configuration memory 560 via the standard JTAG serial interface protocol through serial input data latches 580. Using this serial addressing mode retains the ability to reprogram the DAC at any time without having to reconfigure the interface from one mode to another. Similarly, in SPI mode the DAC can be addressed directly. The SPI serial interface is one of the most widely used protocols for communication with mixed signal devices of all types. While in the SPI addressing mode, programming of the DAC $E^2$ configuration memory 560 is usually not possible.

JTAG/$E^2$ 530: The power-up state of the DAC is determined by configuration memory, for example $E^2$ configuration memory 560. In this mode, the 8-bit DAC input code can still be changed, but only by reprogramming the $E^2$ configuration memory 560 via JTAG command and subject to the maximum number of programming cycles allowed. This mode is preferably used where the DAC setting must be retained when device power has been cycled off and then on again.

Parallel 540: This mode allows direct parallel update access to the DAC via parallel input data latches 550. The DAC can be updated continuously without affecting $E^2$ configuration memory 560 programming cycle endurance. Additionally, DAC $E^2$ configuration memory 560 can still be programmed via serial JTAG commands directly from values stored in parallel input data latches 550.

Figure 6:
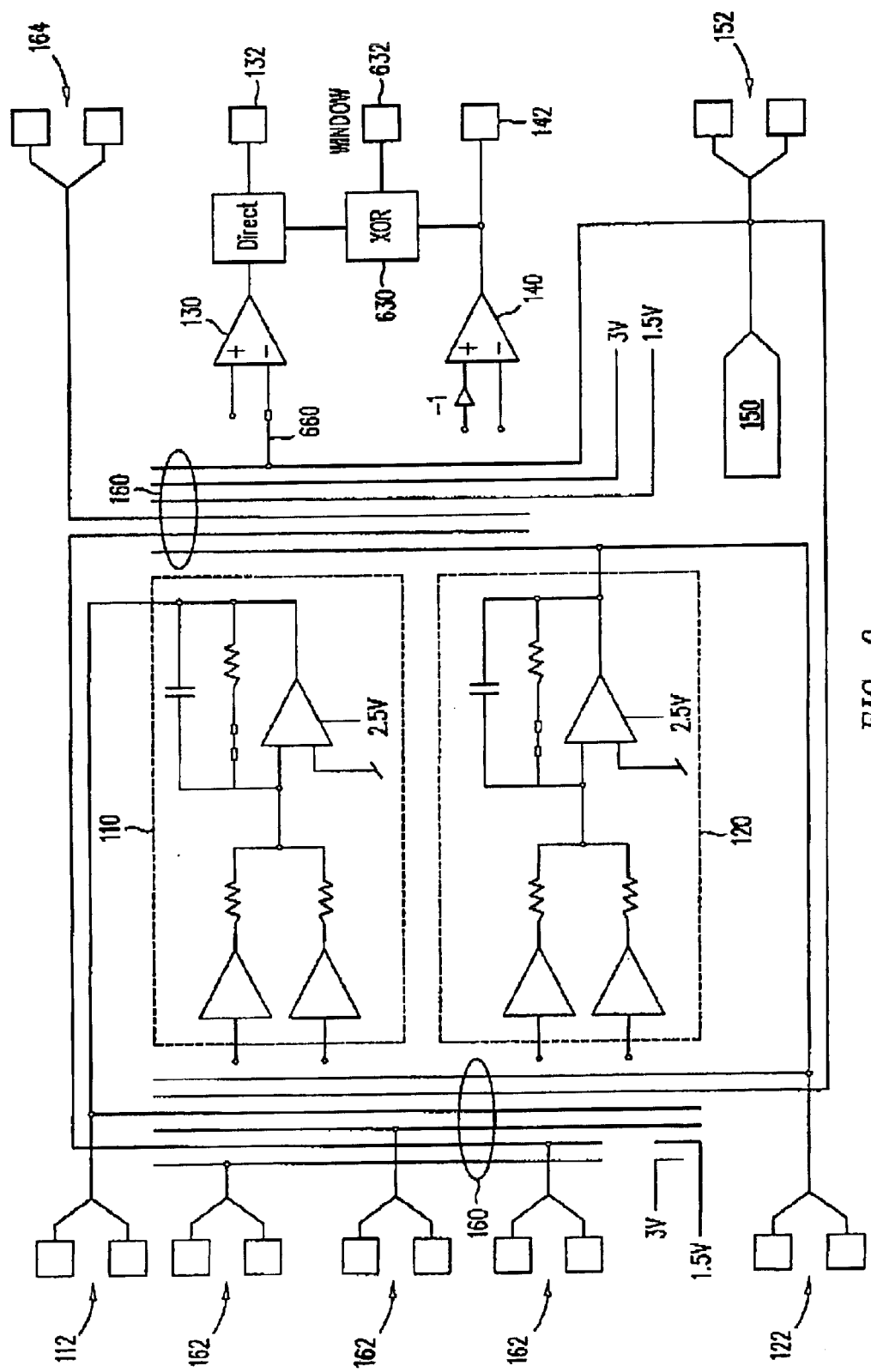
FIG. 6 illustrates functional components of a programmable analog integrated circuit, and the possibilities for interconnecting those components.

FIG. 6 illustrates functional components of a programmable analog integrated circuit, and the possibilities for interconnecting the components. Additionally FIG. 6 is an example of the software-based graphical user interface that can be used to program programmable analog integrated circuits, such as that shown in FIG. 1. For example, the analog routing pool of FIG. 1 is schematically represented by, inter alia, wiring lines 160. Programming a connection through the analog routing pool utilizing software-based graphical user interface is illustrated by line 660 which joins one of the differential inputs of double difference comparator 130 with the differential output of DAC 150. Similarly various input terminals 162 and 164 can be coupled to input terminals of programmable analog circuit blocks 110 and 120 and double difference comparators 130 and 140.

Thus, in the embodiment illustrated in FIG. 6, all inputs to the comparators 130 and 140 can be accessed from several different points including signals external to the programmable analog integrated circuit. When first shown to a user of the software-based graphical user interface, the inputs to the comparators appear not to be connected to any signal source. However, when no connection chosen, the differential input terminals for the comparators can be connected to an internal DC reference voltage. Thus, if one of the differential input terminals of comparator 130 was left unconnected, by the user, the differential voltage on that input would be 0V. Consequently, any positive differential voltage on the other differential input of comparator 130 would result in a logic 1 output, and any negative differential voltage a logic 0.

As illustrated, the plus input path of comparator 140 effectively performs a negation of the differential voltage to that input. The utility of this operation is that an identical differential signal can be applied to the plus inputs of both comparator 130 and 140 and result in a symmetrical window about 2.5V. For example if the +1.5VDC input line is connected to both comparator plus inputs, comparator 130's plus input is +1.5V differential, and comparator 140's plus input is then −1.5V differential. If both minus inputs were both connected to 164 (the external comparator input pins) the result would be a logic 1 on 130 when the external input was below +1.5Vdiff and a logic 1 on 140 whenever it was above −1.5Vdiff. Furthermore, the WINDOW pin 632 (window compare output pin) which is the output terminal for the exclusive OR logic 630 coupled between the two output terminals of comparators 130 and 140, provides a logic 0 signal any time the signal was between +/−1.5Vdiff on the external input and a logic 1 signal anytime it was outside that window.

Still another programming option typically provided to a user is the ability to enable or disable the aforementioned comparator hysteresis. Hysteresis is useful in situations where a slow moving signal, or an uncertain transition condition exists that would otherwise result in excessive noise on the comparator output.

FIG. 6 is merely illustrative of some of the features and programmability of an example of programmable analog integrated circuit, and those having ordinary skill in the are will readily recognize different configurations and programmability options to achieve different analog circuit applications. The invention is not limited by any transistor or capacitor sizes or by voltage levels disclosed herein. The invention is not limited by CMOS technology, and the invention can be implemented in NMOS, PMOS, bipolar or other technologies.

The description of the invention set forth herein is illustrative and is not intended to limit the scope of the invention as set forth in the following claims. Variations and modifications of the embodiments disclosed herein may be made based on the description set forth herein, without departing from the scope and spirit of the invention as set forth in the following claims.

What is claimed is:

1. A programmable analog integrated circuit for receiving a differential analog input signal and providing a processed differential analog output signal, the programmable analog circuit comprising:

a first programmable analog circuit block, the first programmable analog circuit block having first analog circuit block positive and negative input terminals and first analog circuit block positive and negative output terminals;

a double differential comparator, the double differential comparator including:

first comparator positive and negative input terminals;

second comparator positive and negative input terminals; and comparator positive and negative output terminals, the double differential comparator providing a logic high output signal at the comparator output terminals when a first differential voltage applied to the first comparator input terminals is positive with respect to a second differential voltage applied to the second comparator input terminals; and an analog routing pool, the analog routing pool controlling the routing of the differential analog input signal and signals provided by and to the first programmable analog circuit block and the double differential comparator, the analog routing pool being programmable.

2. The programmable analog integrated circuit of claim 1 further comprising:

a memory coupled to the analog routing pool, the memory storing information for use in programming the analog routing pool.

3. The programmable analog integrated circuit of claim 2, wherein the memory is a nonvolatile memory.

4. The programmable analog integrated circuit of claim 1 further comprising:

a second programmable analog circuit block, the second programmable analog circuit block having second analog circuit block positive and negative input terminals and second analog circuit block positive and negative output terminals.

5. The programmable analog integrated circuit of claim 1, wherein the first programmable analog circuit block further comprises:

a first input transconductor, the input transconductor having a programmable transconductance, the input transconductor having an input transconductor positive input terminal and an input transconductor negative input terminal coupled to receive the differential analog input signal and an input transconductor positive output terminal and an input transconductor negative output terminal;

an amplifier, the amplifier including first and second amplifier input terminals and first and second amplifier output terminals, the positive and negative input transconductor output terminals being coupled to the first and second amplifier input terminals, the amplifier output terminals being coupled to the first and second amplifier input terminals, the amplifier output terminals providing the processed differential analog output signal; and a feedback transconductor, the feedback transconductor including a feedback transconductor positive input terminal and a feedback transconductor negative input terminal and a feedback transconductor positive output terminal and a feedback transconductor negative output terminal, the feedback transconductor positive and negative input terminals being coupled to the first and second amplifier output terminals and the feedback transconductor positive and negative output terminals being coupled to the first and second amplifier input terminals.

6. The programmable analog integrated circuit of claim 1 further comprising:

a differential output digital to analog converter, the differential output digital to analog converter having a plurality of digital input terminals and digital to analog converter positive and negative output terminals.

7. The programmable analog integrated circuit of claim 6 wherein the analog routing pool controls the routing of signals provided by the differential output digital to analog converter.

8. The programmable analog integrated circuit of claim 6 wherein the digital to analog converter positive and negative output terminals are selectively coupled, respectively, to at least one of the first comparator positive and negative input terminals, and the second comparator positive and negative input terminals.

9. The programmable analog integrated circuit of claim 6 further comprising:

at least one of a serial peripheral interface (SPI), a Joint Test Access Group (JTAG) interface, and a parallel interface, the plurality of digital input terminals of the differential output digital to analog converter being accessible through the at least one of a serial peripheral interface (SPI), a Joint Test Access Group (JTAG) interface, and a parallel interface.

10. The programmable analog integrated circuit of claim 6 wherein the a differential output digital to analog converter further comprises:

a reference amplifier operable to provide a reference voltage at a reference amplifier output terminal;

a first multiple segment resistor string coupled to the reference amplifier output terminal, the first multiple segment resistor string including:

a first plurality of segment switches and first decode logic; and a second multiple segment resistor string coupled in series with the first multiple segment resistor string, the second multiple segment resistor string including:

a second plurality of segment switches and second decode logic.

11. The programmable analog integrated circuit of claim 1 wherein the double differential comparator further comprises:

a differential input comparator having first and second floating gate input terminals; and a capacitively coupled input stage coupled to the differential input comparator, the capacitively coupled input stage including a plurality of input terminals and providing to the first and second floating gate input terminals a weighted sum of signals applied to the plurality of input terminals.

12. The programmable analog integrated circuit of claim 11 wherein the a differential input comparator further comprises a first p-channel MOSFET and a second p-channel MOSFET, the first and second p-channel MOSFETs being coupled together at their respective source terminals, wherein the first floating gate input terminal is coupled to the gate of the first p-channel MOSFET, and wherein the second floating gate input terminal is coupled to the gate of the second p-channel MOSFET.

13. The programmable analog integrated circuit of claim 11 wherein the capacitively coupled input stage further comprises:

a first comparator positive input capacitor coupled between the first comparator positive input terminal and the first floating gate input terminal;

a first comparator negative input capacitor coupled between the first comparator negative input terminal and the second floating gate input terminal;

a second comparator positive input capacitor coupled between the second comparator positive input terminal and the second floating gate input terminal; and a second comparator negative input capacitor coupled between the second comparator negative input terminal and the first floating gate input terminal.

14. The programmable analog integrated circuit of claim 13 wherein at least one of the input capacitors has at least one trim capacitor coupled in parallel with the at least one of the input capacitors.

15. The programmable analog integrated circuit of claim 14 wherein the at least one trim capacitor includes a plurality of trim capacitors, each of the plurality of trim capacitors coupled in series with an associated manufacturer-controlled switch, and each of the plurality of trim capacitors and associated manufacturer-controlled switches being coupled in parallel with each other of the plurality of trim capacitors coupled in series with an associated manufacturer-controlled switch.

16. The programmable analog integrated circuit of claim 15 wherein the plurality of trim capacitors are numerically weighted.

17. The programmable analog integrated circuit of claim 13 further comprising:

a first hysteresis capacitor selectively coupled in parallel with the second comparator positive input capacitor; and a second hysteresis capacitor selectively coupled in parallel with the second comparator negative input capacitor.

18. The programmable analog integrated circuit of claim 1 further comprising:

a second double differential comparator, the double differential comparator including:

first second comparator positive and negative input terminals;

second second comparator positive and negative input terminals; and second comparator positive and negative output terminals, the second double differential comparator providing a logic high output signal at the second comparator output terminals when a third differential voltage applied to the first second comparator input terminals is positive with respect to a fourth differential voltage applied to the second second comparator input terminals;

wherein the analog routing pool controls the routing of signals provided by and to the second double differential comparator.

19. A double differential comparator comprising:

first and second MOSFETs coupled at their sources to form a differential pair;

first comparator positive and negative input terminals, the first comparator positive input terminal coupled to the gate of the first MOSFET and the first comparator negative input terminal coupled to the gate of the second MOSFET;

second comparator positive and negative input terminals, the second comparator positive input terminal coupled to the gate of the second MOSFET and the second comparator negative input terminal coupled to the gate of the first MOSFET; and comparator positive and negative output terminals, the double differential comparator providing a logic high output signal at the comparator output terminals when a first differential voltage applied to the first comparator input terminals is positive with respect to a second differential voltage applied to the second comparator input terminals.

20. A double differential comparator comprising:

a differential input comparator having first and second floating gate input terminals;

a capacitively coupled input stage coupled to the differential input comparator, the capacitively coupled input stage including first comparator positive and negative input terminals and second comparator positive and negative input terminals providing to the first and second floating gate input terminals a weighted sum of signals applied to the comparator input terminals; and comparator positive and negative output terminals, the double differential comparator providing a logic high output signal at the comparator output terminals when a first differential voltage applied to the first comparator input terminals is positive with respect to a second differential voltage applied to the second comparator input terminals.

21. The double differential comparator of claim 20 wherein the differential input comparator further comprises a first p-channel MOSFET and a second p-channel MOSFET, the first and second p-channel MOSFETs being coupled together at their respective source terminals, wherein the first floating gate input terminal is coupled to the gate of the first p-channel MOSFET, and wherein the second floating gate input terminal is coupled to the gate of the second p-channel MOSFET.

22. The double differential comparator of claim 20 wherein the capacitively coupled input stage further comprises:

a first comparator positive input capacitor coupled between the first comparator positive input terminal and the first floating gate input terminal;

a first comparator negative input capacitor coupled between the first comparator negative input terminal and the second floating gate input terminal;

a second comparator positive input capacitor coupled between the second comparator positive input terminal and the second floating gate input terminal; and a second comparator negative input capacitor coupled between the second comparator negative input terminal and the first floating gate input terminal.

23. The double differential comparator of claim 22 wherein at least one of the input capacitors has at least one trim capacitor coupled in parallel with the at least one of the input capacitors.

24. The double differential comparator of claim 23 wherein the at least one trim capacitor includes a plurality of trim capacitors, each of the plurality of trim capacitors coupled in series with an associated manufacturer-controlled switch, and each of the plurality of trim capacitors and associated manufacturer-controlled switches being coupled in parallel with each other of the plurality of trim capacitors coupled in series with an associated manufacturer-controlled switch.

25. The double differential comparator of claim 24 wherein the plurality of trim capacitors are numerically weighted.

26. The double differential comparator of claim 22 further comprising:

a first hysteresis capacitor selectively coupled in parallel with the second comparator positive input capacitor; and a second hysteresis capacitor selectively coupled in parallel with the second comparator negative input capacitor.

* * * * *